United States Patent
Chakrabarti

(10) Patent No.: US 9,276,069 B2
(45) Date of Patent: Mar. 1, 2016

(54) PROTECTIVE INTERFACE IN SILICON CARBIDE SEMICONDUCTOR DEVICES

(71) Applicant: Global Power Device Company, Lake Forest, CA (US)

(72) Inventor: Utpal K. Chakrabarti, Allentown, PA (US)

(73) Assignee: Global Power Technologies Group, Inc., Lake Forest, CA (US)

( * ) Notice: Subject to any disclaimer, the term of this patent is extended or adjusted under 35 U.S.C. 154(b) by 81 days.

(21) Appl. No.: 14/091,258

(22) Filed: Nov. 26, 2013

(65) Prior Publication Data

US 2014/0145211 A1 May 29, 2014

Related U.S. Application Data

(60) Provisional application No. 61/729,970, filed on Nov. 26, 2012.

(51) Int. Cl.
| | |
|---|---|
| *H01L 31/0312* | (2006.01) |
| *H01L 29/16* | (2006.01) |
| *H01L 29/51* | (2006.01) |
| *H01L 21/04* | (2006.01) |
| *H01L 29/66* | (2006.01) |
| *H01L 29/78* | (2006.01) |

(52) U.S. Cl.
CPC .......... *H01L 29/1608* (2013.01); *H01L 21/045* (2013.01); *H01L 21/049* (2013.01); *H01L 29/513* (2013.01); *H01L 29/518* (2013.01); *H01L 29/66068* (2013.01); *H01L 29/7802* (2013.01)

(58) Field of Classification Search
CPC ............ H01L 21/049; H01L 21/28158; H01L 29/267; H01L 29/511; H01L 29/66068; H01L 29/78; H01L 29/7883; H01L 29/802; H01L 29/803; H01L 29/1608; H01L 29/2003
USPC .............................................. 438/46, 93, 197
See application file for complete search history.

(56) References Cited

U.S. PATENT DOCUMENTS

| | | | |
|---|---|---|---|
| 2006/0194379 A1* | 8/2006 | Suda et al. ..................... 438/197 |
| 2010/0051961 A1* | 3/2010 | Kuraoka et al. ................. 257/76 |
| 2014/0145211 A1* | 5/2014 | Chakrabarti ..................... 257/77 |

OTHER PUBLICATIONS

Radtke et al., Initial stages of SiC oxidation investigated by ion scattering and angle-resolved x-ray photoelectron spectroscopies, Appl. Phy. Lett., 78(23):3601-3603, 2001.
Okumura et al., Over-700-nm Critical Thickness of AlN Grown on 6H-SiC(0001) by Molecular Beam Epitaxy, Appl. Phy. Express 5, 105502-1-105502-3, 2012.

* cited by examiner

*Primary Examiner* — Dung Le
(74) *Attorney, Agent, or Firm* — Perkins Coie LLP

(57) ABSTRACT

Methods, systems, and devices are disclosed for implementing high power circuits and semiconductor devices. In one aspect, a method for fabricating a silicon carbide (SiC) device includes forming a thin layer of a protection material over a SiC substrate, in which the protection material has a lattice constant that substantially matches a lattice constant of SiC and the thin layer has a thickness of less than a critical layer thickness for the protection material over SiC to form a uniform interface between the protection material and SiC, forming a layer of an insulator material over the thin layer of the protection material, and forming one or more transistor structures over the insulator material.

9 Claims, 3 Drawing Sheets

PROTECTIVE INTERFACE IN SILICON CARBIDE SEMICONDUCTOR DEVICES

CROSS REFERENCE TO RELATED APPLICATIONS

This patent document claims the benefit of U.S. Provisional Patent Application No. 61/729,970, filed on Nov. 26, 2012, entitled "PROTECTIVE INTERFACE IN SILICON CARBIDE SEMICONDUCTOR DEVICES". The entire content of the before-mentioned patent application is incorporated by reference as part of the disclosure of this document.

TECHNICAL FIELD

This patent document relates to semiconductor technologies.

BACKGROUND

Silicon carbide (SiC) semiconductor materials can exist in various crystalline forms and can be used to construct various SiC based circuits and devices. In comparison with the commonly used silicon, SiC materials possess properties such as a wide bandgap structure and higher breakdown field. These properties make SiC materials attractive for a wide range of circuits and applications including high power electronics.

SUMMARY

Techniques, systems, and devices are disclosed for implementing high power circuits and semiconductor devices based on SiC materials.

In one aspect, a method for fabricating a silicon carbide (SiC) device includes forming a thin layer of a protection material over a SiC substrate, in which the protection material has a lattice constant that substantially matches a lattice constant of SiC and the thin layer has a thickness of less than a critical layer thickness for the protection material over SiC to form a uniform interface between the protection material and SiC, forming a layer of an insulator material over the thin layer of the protection material, and forming one or more transistor structures using the insulator material.

In another aspect of the disclosed technology, a silicon carbide device includes a SiC substrate, a thin layer of a protection material formed over the SiC substrate, in which the protection material has a lattice constant that substantially matches a lattice constant of SiC and the thin layer has a thickness of less than a critical layer thickness for the protection material over SiC to form a uniform interface between the protection material and SiC, a layer of an insulator material over the thin layer of the protection material, and one or more transistor structures over the insulator material.

In yet another aspect, a silicon carbide metal insulator semiconductor field effect transistor (MISFET) device is provided to include a SiC substrate; a first electrical contact formed on a first surface of the SiC substrate as one terminal of the MISFET device; a SiC epitaxial layer formed on a second surface of the SiC substrate opposing the first surface; a thin layer of a protection material formed over the SiC epitaxial layer, wherein the protection material has a lattice constant that substantially matches a lattice constant of SiC and the thin layer has a thickness of less than a critical layer thickness for the protection material over SiC to form a uniform interface between the protection material and SiC; a layer of an insulator material over the thin layer of the protection material; a gate contact formed over the layer of the insulator material as a second terminal of the MISFET device; a doped region formed in the SiC epitaxial layer offset from and near a region in the SiC epitaxial layer under the gate contact; and a second electrical contact formed over the doped region as a third terminal of the MISFET device.

Those and other aspects and their variations are described in greater detail in the drawings, the description and the claims.

DETAILED DESCRIPTION

Techniques, systems, and devices are disclosed for implementing high power circuits and semiconductor devices based on SiC materials with a protection interface layer formed on SiC.

Silicon carbide can be used as a semiconductor material for fabricating power electronic devices, e.g., such as field effect transistors used in power control applications, including high power circuits. Fabrication of such field effect transistors can include creating an insulator on a silicon carbide (SiC) substrate. For example, in the case of a silicon dioxide ($SiO_2$) insulator material on the SiC substrate, a disturbed interface exists between the $SiO_2$ and the SiC due to the changed surface stoichiometry, which can result in a surface roughness that have negative effects on the performance of the device. For example, a layer of $SiO_2$ insulator material can be grown on the SiC material at high temperature (e.g., within a range 900° C. to 1200° C.) in an oxidizing environment, e.g., including, but not limited to, dry oxygen, wet oxygen, steam, nitrous oxide, nitric oxide, among other oxygenated environments. For example, such a process of creating an insulator like $SiO_2$ can often lead to a complex interface and a non-stoichiometric surface of SiC.

Figure 1:
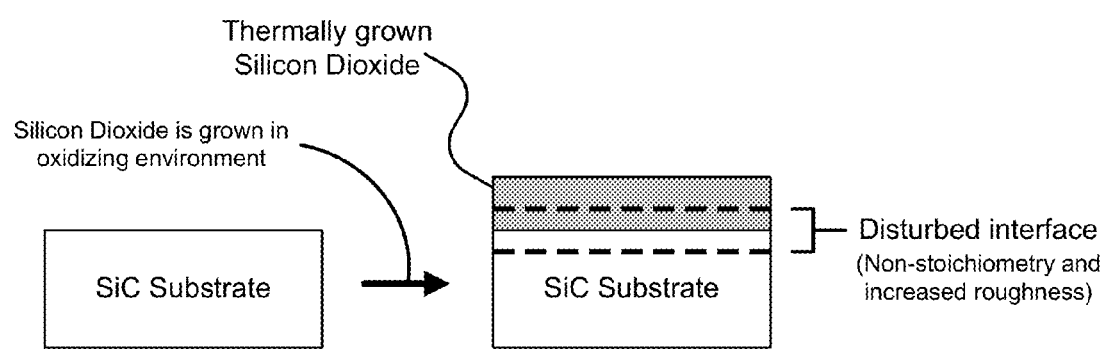
FIG. 1 shows a schematic of a device including a silicon dioxide layer grown on a silicon carbide substrate.

FIG. 1 shows a schematic of a device including a $SiO_2$ layer grown on a SiC substrate, in which the interface between the $SiO_2$ layer and the SiC substrate forms a disturbed layer (e.g., having a non-stoichiometry and increased roughness). The performance of an exemplary field effect transistor is very sensitive to the quality of the topmost surface of SiC. Hence, it is important to protect the outermost surface of SiC during the creation of an insulator layer.

For example, a disturbed/rough interface formed between the SiC and a top silicon oxide/insulator layer can give rise to a number of undesired results, including. (1) the rough interface formed between the SiC and the insulator layer that tends to have spatial variations that randomly change from one location to another on the interface. This can change electrical properties (e.g., carrier mobility or electrical resistance) from one location to another. This random spatial variation is undesirable in that it creates random variations from one device (e.g., such as a field effect transistor (FET)) to another device formed on the substrate. (2) the rough interface tends to increase the resistance and thus decrease carrier mobility in the device. This can significantly degrade the device performance.

In one aspect, the disclosed technology includes methods to create a protection layer such as an aluminum nitride (AlN) layer, on SiC surface in an exemplary SiC device. For example, the method can include forming a thin layer of the protection material over a SiC substrate, in which the protection material has a lattice constant that substantially matches a lattice constant of SiC and the thin layer has a thickness of less than a critical layer thickness for the protection material over SiC to form a uniform interface between the protection material and SiC, forming a layer of an insulator material over the thin layer of the protection material, and forming one or more transistor structures over the insulator material. AlN is one exemplary material for the protection layer and other materials with closely matched lattice constants may also be used.

Figure 2:
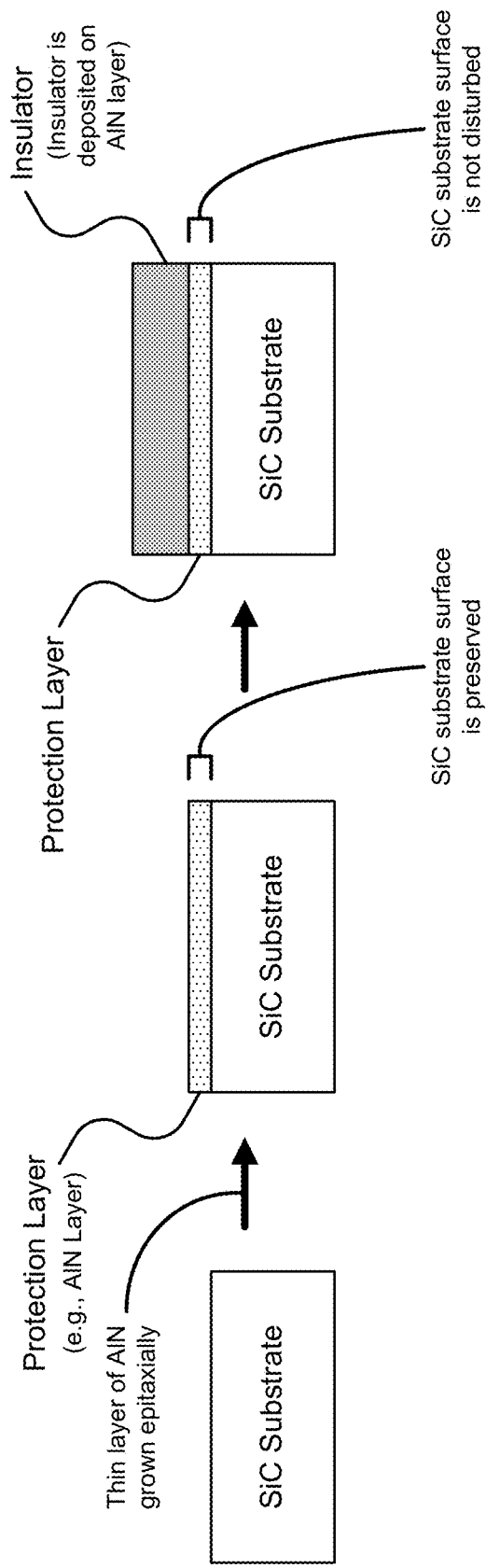
FIG. 2 shows a schematic of a device including a layer of aluminum nitride configured between a silicon carbide substrate and an outer insulator layer.

FIG. 2 shows a schematic of a device including a layer of AlN configured between a SiC substrate and an outer insulator layer (e.g., such as $SiO_2$), in which the AlN layer protects the SiC surface from disturbance by the insulator layer.

The disclosed technology includes a protection layer that is formed of a protection material with a lattice constant that substantially matches that of the SiC material, e.g., with a lattice mismatch at or less than 1%. This lattice-matched protection material is grown on the top SiC surface as a thin layer which has a thickness less than the critical layer thickness so that the lattice-matched protection material on top of the SiC has a uniform lattice structure and smooth interface with the underlying SiC. Such a protective interface can avoid the aforementioned issues associated with the rough interface. On top of the protection layer, an insulator layer is formed. This insulator layer can include a silicon oxide layer.

In some implementations, AlN can be grown epitaxially on SiC (e.g., such as an SiC substrate) to form a thin layer between the SiC and topmost insulator material. The lattice mismatch between AlN and SiC is relatively small and is only about 1%. For example, the AlN can be grown on the SiC surface by using any of the following methods, e.g., including, but not limited to, organometallic chemical vapor deposition (OMCVD), molecular beam epitaxy (MBE), gas source molecular beam epitaxy (GS-MBE), RF plasma assisted molecular beam epitaxy (RF-MBE), and physical vapor deposition (PVD) using various sputtering technologies and/or ion assisted deposition technologies. For example, the AlN protection layer can be grown in layer by layer growth mode (e.g., grown over the SiC substrate by growing one monolayer at a time) or by 3D nucleation.

As described above, the AlN layer can function to provide protection of SiC surface during the insulator deposition. The AlN layer should be grown on a clean SiC surface. In some examples, this can be accomplished by in situ etching of SiC surface to be followed immediately by the growth of AlN layer without exposing the surface of SiC to the ambient environment. AlN can be configured to be a thin layer, e.g., not to exceed a critical layer thickness, e.g., about 4.6 nm. In some examples, the AlN layer thickness can be configured to be as thin as, e.g., 2 nm. In some examples, the AlN layer thickness can be configured to be in a suitable range, e.g., from 0.5 nm to 1 nm. However, a much thicker layer of AlN can be grown epitaxially. In some implementations, the disclosed method can include growing the AlN protection layer using such a growth technique.

For example, following the deposition of the AlN layer, a layer of an insulator material can be grown on the AlN layer. Numerous types of insulators may be grown on the AlN. Exemplary insulator materials and their combinations include, but are not limited to, for example, $SiO_2$, $Al_2O_3$, $TiO_2$, $Ta_2O_5$, $HfO_2$, $ZrO_2$, $Y_2O_3$, $La_2O_3$, $Pr_2O_3$, SiON, and AlON. In some implementations, the high quality insulators can be grown at relatively low temperature, e.g., by atomic layer deposition (ALD) or remote plasma enhanced chemical vapor deposition (RPECVD). The forming of the insulator can include utilizing options during the forming whereby the previously grown interface of AlN and SiC is not disturbed. In some examples, a stack of multilayer dielectric can be formed to improve the performance of the transistor device.

Figure 3:
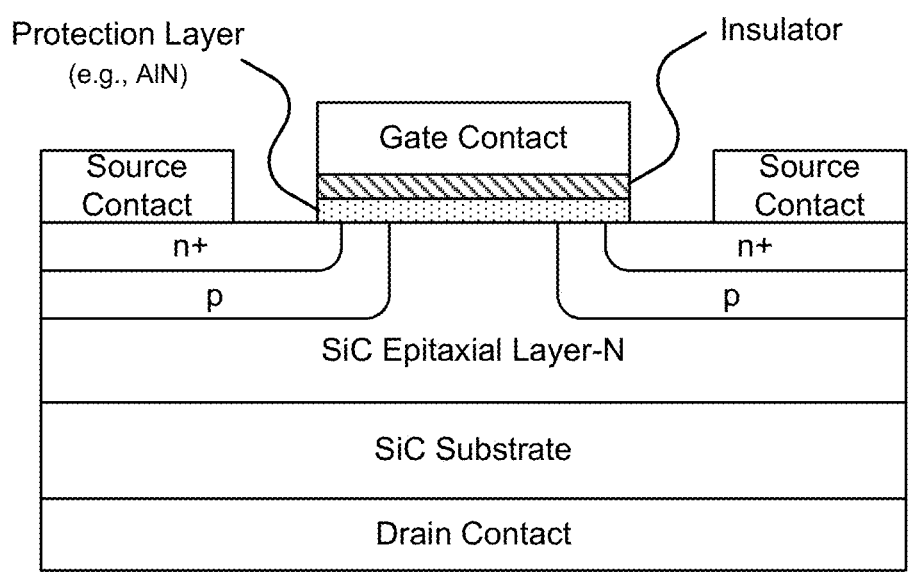
FIG. 3 shows a schematic of an exemplary silicon carbide metal insulator semiconductor field effect transistor device.

FIG. 3 shows a schematic of an exemplary silicon carbide metal insulator semiconductor field effect transistor (MISFET) device that includes an AlN protection layer between an insulator layer and a SiC Epi/SiC substrate. The device can include a base structure including a SiC substrate configured between a drain contact (e.g., drain electrode) and an SiC epitaxial layer-N. A region of the SiC epitaxial layer-N can be configured to provide a contact surface at the top of the base structure that interfaces with the exemplary AlN protection layer. The insulator layer is configured above the protection layer, e.g., forming a nondisturbed interface with the SiC epitaxial layer-N via the lattice-matched protection material AlN. The SiC MISFET device can include a gate contact configured above the insulator layer. The SiC MISFET device can include an n+ layer formed on a p-type well region formed on the SiC epitaxial layer-N. The SiC MISFET device can include source contacts that interface with the n+ layer of the SiC MISFET device.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:
1. A silicon carbide (SiC) device, comprising:
a SiC substrate;
a thin layer of a protection material formed over the SiC substrate, wherein the protection material has a lattice constant that substantially matches a lattice constant of SiC and the thin layer has a thickness of less than a critical layer thickness for the protection material over SiC to form a uniform interface between the protection material and SiC;
a layer of an insulator material over the thin layer of the protection material; and one or more transistor structures over the insulator material, wherein the SiC device further comprises:
a metal insulator semiconductor field effect transistor (MISFET) device formed over the SiC substrate,
wherein the MISFET includes
   a first electrical contact formed on a first surface of the SiC substrate as one terminal of the MISFET device;
   a SiC epitaxial layer formed on a second surface of the SiC substrate opposing the first surface so that the thin layer of the protection material is formed over the SiC epitaxial layer;
   a gate contact formed over the layer of the insulator material as a second terminal of the MISFET device;
   a doped region formed in the SiC epitaxial layer offset from and near a region in the SiC epitaxial layer under the gate contact; and
   a second electrical contact formed over the doped region as a third terminal of the MISFET device.

2. The device as in claim 1, wherein the protection material includes AlN, the AlN including a lattice constant that differs from a lattice constant of SiC by 1%.

3. The device as in claim 2, wherein the AlN layer has a thickness less than 4.6 nm and greater than 0.5 nm.

4. The device as in claim 3, wherein the AlN layer has a thickness less than 2 nm.

5. The device as in claim 3, wherein the AlN layer has a thickness less than 1 nm.

6. The device as in claim 1, wherein the insulator material includes silicon oxide.

7. The device as in claim 1, wherein the first electrical contact is a contact for a drain of the MISFET device and the second electrical contact is a contact for a source of the MISFET device.

8. The device as in claim 1, wherein the insulator material includes SiO2, Al2O3, TiO2, Ta2O5, HfO2, ZrO2, Y2O3, La2O3, Pr2O3, SiON, or AlON.

9. The device as in claim 1, wherein the SiC epitaxial layer includes a region configured to provide a contact surface interfacing with the thin layer.

* * * * *